United States Patent Office 3,846,168

Patented Nov. 5, 1974

3,846,168

METHOD OF FORMING BONDABLE SUBSTRATE SURFACES

Glenn V. Elmore, Vestal, N.Y., assignor to International Business Machines Corporation, Armonk, N.Y.

No Drawing. Filed July 2, 1973, Ser. No. 376,105
Int. Cl. B44d *1/20;* C23b *5/62;* C23f *1/00*
U.S. Cl. 117—213 11 Claims

ABSTRACT OF THE DISCLOSURE

Dielectric substrates are formed by laminating with a pretreated aluminum foil whereby the substrate after removal of or separation from the aluminum has a microroughened or nodular surface which is receptive to adherent coatings of metal plate. Printed circuit boards and other metal-plated plastic substrates are prepared by bonding pretreated aluminum foil to a plastic substrate to provide a sacrificial cladding on the substrate, then stripping the aluminum chemically from the substrate, catalyzing the stripped surface and depositing a conductor metal plate thereon by electroless and/or electrolytic deposition process.

BACKGROUND OF THE INVENTION

1. Field of the Invention

The present invention is directed to a method for forming bondable substrate surfaces. More specifically, the invention is directed to a method of pretreating an aluminum foil for lamination with a plastic substrate material and thereafter chemically stripping the aluminum from the substrate to provide a surface having greatly enhanced bonding characteristics.

2. Prior Art

Epoxy impregnated fiberglass elements are presently being used as printed circuit boards, either single layered or as laminants. In the preparation of printed circuitry, it is of the utmost importance that metal disposed upon the surface or board adhere strongly thereto. In the prior art while it is possible to plate a film of metal on epoxy boards, it is impossible to provide any substantial amount of adherence between the film of metal and the epoxy board. That is, in nearly every case the metal film is readily peeled from the surface of the epoxy by using a small amount of force and in some instances the metal film actually falls off of the surface of the epoxy board in the electroplating solution. This lack of adhesion is partially due to the fact that in all prior roughening methods the material at the surface of the epoxy board is damaged and weakened. Thus, even though a good mechanical bond is obtained the surface of the epoxy easily breaks away thereby greatly lowering the force required to peel the metal film from the plastic surface.

Two distinct methods of manufacture of printed circuit boards have been used in general. One is the "subtractive" method and the other is called the "additive" procedure. The additive method of manufacturing boards starts with a nonconductive substrate, free of any copper foil, to which desired areas of the substrate are made conductive. The procedure presents a number of advantages over the subtractive method and many attempts have been made to produce suitable additive circuit boards. The major obstacle to successful additive printed circuit boards is the difficulty of obtaining adequate adhesion between the chemically deposited copper or other conductive metals and the dielectric substrate.

U.S. Pat. 2,871,171 teaches a method of electroplating copper on aluminum and the replacement of an oxide coating on aluminum with zinc or alkaline etching for increased copper plating adhesion. U.S. Pat. 3,620,933 discloses a process in which plastic parts are formed against an anodically treated aluminum surface by molding, laminating, or the like whereby the surface of the formed part after removal of or separation from the aluminum has a high-energy level which is receptive to adherent coatings of paint or metal plate.

None of the prior art discloses or suggests the pretreatment of aluminum foil by the technique of using sodium hydroxide, zinc oxide and cupric oxide in order to produce small nodules on the surface of the aluminum after which the aluminum foil is laminated to the substrate prepreg so that the nodular surface of the aluminum is replicated on the plastic substrate surface.

SUMMARY OF THE INVENTION

There is provided a method for the pretreatment of an aluminum foil which includes precleaning a sheet of approximately 1 mil aluminum foil in a sodium hydroxide solution for approximately 5 minutes, then treating the aluminum foil in a 50% solution of nitric acid for approximately 1 minute, and thereafter treating the aluminum foil in a solution of zinc oxide, cupric oxide, and sodium hydroxide for approximately 10 minutes at room temperature. After drying, the pretreated aluminum foil is then laminated to a dielectric substrate material followed by the removal of the zinc and aluminum from the substrate by immersion in an etching bath. The so-treated substrate is then catalyzed and electroless plated with conductive metal by conventional process to the desired thickness.

It is a primary object of the invention to provide a method for pretreating aluminum foil for lamination with a plastic material to produce a superior adhesive bonding surface on the substrate receptive to the plating of conductive metal to the substrate.

Another object of the invention is to provide a method for preparing aluminum sheet or foil bonded to a plastic substrate whereupon after stripping of the aluminum yields a substrate having a surface receptive to an adherent coating of plated metal coatings.

It is another object of the invention to provide a novel method for treating substrate surfaces prior to metal deposition thereon.

The foregoing and other objects, features and advantages of the invention will be apparent from the following more particular description of a preferred embodiment of the invention.

DESCRIPTION OF THE PREFERRED EMBODIMENT

The method of this invention as it relates to circuit substrate manufacture involves first the precleaning of a sheet of aluminum foil. A sheet of approximately 1 mil thick aluminum foil, although sheets in the 0.5 to 5.0 mil thick range can be used satisfactorily, is precleaned in a sodium hydroxide (NaOH) solution of approximately 20 grams/liter for a period of about 5 minutes. This is followed by a rinsing of the aluminum foil in water and then treating the foil in a 50% solution of nitric acid ($HNO_3$) for about 1 minute. Again the foil is rinsed in water. The pretreated aluminum is now ready for a treating operation that develops a micro-nodular coating or surface thereon. The micro-nodular surface is produced by treating the aluminum foil in a solution of zinc oxide (ZnO), cupric oxide (CuO), and sodium hydroxide (NaOH), preferably for a period of approximately 10 minutes and at room temperature. The treatment solution is preferably made as follows:

100 grams ZnO/l
0.2 gram CuO/l
270 grams NaOH/l

Suitable solution preparations may be made from the following:

| Component | Grams per liter | |
|---|---|---|
| | Lower limit | Upper limit |
| ZnO | 20 | 200 |
| CuO | Saturated | |
| NaOH | 200 | 500 |

The treatment time can vary from 1 to 20 minutes. Thereafter, the foil is rinsed in de-ionized water and dried by air or oven device. The resulting product is an aluminum sheet or foil having a micro-nodular surface.

The substrate of this invention can be prepared by using a wide variety of plastic substrates which are well known in the art. Useful plastics include those prepared from both thermoplastic and thermosetting resins. Typical thermosetting resins which are useful in this invention are the phenolic-type materials, such as the copolymers of phenol, resorcinol, a cresol, or similar materials. Thermoplastic materials suitable for the substrate manufacturing include polyolefins, such as polypropylene, polysulfones, ABS, polycarbonate, FEP, etc.

Thermosetting resins employed in preparing a type of the substrates of this invention are utilized in the form of thin sheets of resin known as prepregs. In the prepregs the thermosetting resins are in a partially cured condition known as the B-stage and they are still fusible under heat and pressure. Resins in the B-stage can be completely cured by the application of sufficient heat and pressure to yield rigid, infusible thermoset materials.

The so-treated aluminum is laminated to a dielectric substrate material. Bonding of a thermoplastic substrate to the aluminum foil is carried out by pressing together a sheet of the thermoplastic material and a sheet of the aluminum foil having the micro-nodular surface next to the plastic, in a preheated laminating press at a predetermined pressure and temperature as for example 500 lbs./square inch and 340° F. The time of the pressing operation is variable depending upon the particular plastic utilized and the pressure employed. The laminar structure is now immersed in an etching bath of hydrochloride (HCl) solution or any of the well-known aluminum etchants to remove the zinc and aluminum from the substrate. When the aluminum foil is laminated with the prepreg material the nodular surface of the aluminum foil is replicated on the plastic surface.

Optionally, if it is desired to remove the copper from the substrate, the substrate can be immersed for approximately 1 minute in a solution of ammonium persulfate [$(NH_4)2S_2O_8$], or cupric chloride ($CuCl_2$), hydrochloric acid (HCl) or other copper etchant.

The substrate prepared by the method of the instant invention can be electroless copper plated or electroless and electrolytic copper plated by any of the well-known and conventional processes. If desired, the substrate can be sensitized in stannous chloride ($SnCl_2$) solution and activated by immersion in a palladium chloride ($PdCl_2$) solution (approximately 1 gram $PdCl_2$/1) for a period of approximately 5 minutes at room temperature. Thereafter, the substrate is rinsed in de-ionized water and dried.

While the invention has been particularly shown and described with reference to preferred embodiments thereof, it will be understood by those skilled in the art that various changes in form and details may be made therein without departing from the spirit and scope of the invention.

What is claimed is:

1. A method for preparing a printed circuit board with improved adhesion between the conductor metal and a nonconductive substrate comprising the steps of:

(a) precleaning a sheet of aluminum foil in a sodium hydroxide (NaOH) solution, (b) rinsing the aluminum foil in water, (c) treating the aluminum foil in a 50% solution of nitric acid ($HNO_3$), (d) rinsing the aluminum foil in water, (e) treating the aluminum foil in a solution of zinc oxide (ZnO), cupric oxide (CuO), and sodium hydroxide (NaOH), (f) rinse in de-ionized water, (g) dry the aluminum foil, (h) laminate the treated aluminum foil to a dielectric substrate material, (i) remove zinc and aluminum from the substrate by immersion in an etching bath, (j) catalyze the substrate for electroless metal deposition, and (k) electroless plate the catalyzed substrate with conductive metal to the desired thickness.

2. A method for preparing a printed circuit board as described in claim 1 wherein the aluminum foil is 0.5 to 5.0 mils thick.

3. A method for preparing a printed circuit board as described in claim 1 wherein the aluminum foil is preferably about 1 mil thick.

4. A method for preparing a printed circuit board as described in claim 1 wherein the sodium hydroxide solution is about 20 grams/liter.

5. A method for preparing a printed circuit board as described in claim 1 wherein the treating solution for the aluminum foil is a combination of zinc oxide from 20 g./l. to about 200 g./l., saturated cupric oxide, and sodium hydroxide from about 200 g./l. to about 500 g./l.

6. A method for preparing a printed circuit board as described in claim 1 wherein the solution for treating the aluminum foil is 100 grams ZnO/l., 0.2 grams CuO/l. and 270 grams NaOH/l.

7. A method for preparing a printed circuit board as described in claim 1 wherein the etching bath is hydrochloride solution.

8. A method for preparing a printed circuit board with improved adhesion between the conductor metal and a nonconductive substrate comprising the steps of:

(a) precleaning a sheet of aluminum foil in a sodium hydroxide (NaOH) solution for approximately 5 minutes, (b) rinsing the aluminum foil in water, (c) treating the aluminum foil in a 50% solution of nitric acid ($HNO_3$) for approximately 1 minute, (d) rinsing the aluminum foil in water, (e) treating the aluminum foil in a solution of zinc oxide (ZnO), cupric oxide CuO), and sodium hydroxide (NaOH) for approximately 10 minutes at room temperature, (f) rinse in de-ionized water, (g) dry the aluminum foil, (h) laminate the treated aluminum foil to a dielectric substrate material, (i) remove zinc and aluminum from the substrate by immersion in an etching bath, (j) catalyze the substrate for electroless metal deposition, and (k) electroless plate the catalyzed substrate with conductive metal to the desired thickness.

9. A method for preparing a printed circuit board with improved adhesion between the conductor metal and a nonconductive substrate comprising the steps of:

(a) precleaning a sheet of aluminum foil (0.5 to 5.0 mils thick) in a sodium hydroxide (NaOH) solution of about 20 g./l. for approximately 5 minutes.

(b) rinsing the aluminum foil in water, (c) treating the aluminum foil in a 50% solution of nitric acid ($HNO_3$) for approximately 1 minute, (d) rinsing the aluminum foil in water, (e) treating the aluminum foil in a solution of zinc oxide (ZnO), cupric oxide (CuO), and sodium hydroxide (NaOH) from 1 to 20 minutes at room temperature, (f) rinse in de-ionized water,
(g) dry (air or oven),
(h) sensitize in stannous chloride ($SnCl_2$) solution,
(i) activate the substrate by immersion in palladium chloride ($PdCl_2$) solution for approximately 5 minutes at room temperature.
(j) rinse in de-ionized water,
(k) dry,
(l) laminate the treated aluminum foil to a dielectric substrate material,
(m) remove zinc and aluminum from the substrate by immersion in an etching bath,
(n) catalyze the substrate for electroless metal deposition, and
(o) electroless plate the catalyzed substrate with conductive metal to the desired thickness.

10. A method for preparing a printed circuit board as described in claim 9 wherein the solution for treating the aluminum foil is 100 grams ZnO/l., 0.2 grams CuO/l. and 270 grams NaOH/l.

11. A method for preparing a printed circuit board as described in claim 9 wherein the etching bath is hydrochloride solution.

References Cited

UNITED STATES PATENTS

| | | | |
|---|---|---|---|
| 2,932,599 | 4/1960 | Dahlgren | 156—3 X |
| 3,438,127 | 4/1969 | Lehtonen | 29—625 |

WILLIAM A. POWELL, Primary Examiner

U.S. Cl. X.R.

117—47; 156—3, 18, 22; 252—79.5